United States Patent
Daulton et al.

(10) Patent No.: US 6,315,871 B1
(45) Date of Patent: Nov. 13, 2001

(54) METHOD FOR FORMING DIAMONDS FROM CARBONACEOUS MATERIAL

(75) Inventors: Tyrone Daulton, Slidell, LA (US); Roy Lewis, Evanston, IL (US); Lynn Rehn, LaGrange, IL (US); Marquis Kirk, Hinsdale, IL (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 09/451,265

(22) Filed: Nov. 30, 1999

(51) Int. Cl.[7] .................................................. C01B 31/00
(52) U.S. Cl. ................... 204/157.47; 204/157.44
(58) Field of Search ........................... 204/157.44, 157.47

(56) References Cited

U.S. PATENT DOCUMENTS 5,374,318 * 12/1994 Rabalais et al. ...................... 148/33
5,773,834 * 6/1998 Yamamoto et al. .............. 250/423 F

FOREIGN PATENT DOCUMENTS

280198 * 8/1988 (EP) .

* cited by examiner

Primary Examiner—Edna Wong
(74) Attorney, Agent, or Firm—Mark LaMarre; Mark Dvorscak; Virginia B. Caress

(57) ABSTRACT

A method for producing diamonds is provided comprising exposing carbonaceous material to ion irradiation at ambient temperature and pressure.

20 Claims, 3 Drawing Sheets

| (h k l) | Data (Å) | Diamond (Å) | Δ Å |
|---|---|---|---|
| 1 1 1 | 2.067 | 2.059 | -0.008 |
| 2 0 0* | 1.789 | 1.783 | -0.006 |
| 2 2 0 | 1.261 | 1.261 | 0.000 |
| 3 1 1 | 1.079 | 1.075 | -0.004 |
| 2 2 2 | 1.021 | 1.030 | 0.009 |
| 4 0 0 | 0.894 | 0.892 | -0.002 |
| 3 3 1 | 0.817 | 0.818 | 0.001 |
| 4 2 0* | 0.794 | 0.798 | 0.004 |
| 4 2 2 | 0.727 | 0.728 | 0.001 |
| 3 3 3 | 0.686 | 0.686 | 0.000 |
| 5 1 1 | | 0.686 | |
| 4 4 0 | 0.630 | 0.631 | 0.001 |
| 5 3 1 | 0.597 | 0.603 | 0.006 |
| 6 0 0* | | 0.595 | |
| 4 4 2* | | 0.595 | |
| 6 2 0 | 0.565 | 0.564 | -0.001 |
| 5 3 3 | 0.536 | 0.544 | 0.008 |
| 6 2 2* | | 0.538 | |
| 4 4 4 | | 0.515 | |
| 5 5 1 | 0.494 | 0.499 | 0.005 |
| 7 1 1 | | 0.499 | |
| 6 4 0 | | 0.494 | |
| 6 4 2 | 0.472 | 0.477 | 0.005 |
| 5 5 3 | 0.460 | 0.464 | 0.004 |
| 7 3 1 | | 0.464 | |
| 8 0 0 | | 0.446 | |
| 7 3 3 | 0.430 | 0.436 | 0.006 |
| 6 4 4* | | 0.433 | |
| * Kinematically forbidden reflection | | | |

FIG 3

METHOD FOR FORMING DIAMONDS FROM CARBONACEOUS MATERIAL

CONTRACTUAL ORIGIN OF THE INVENTION

The United States Government has rights in this invention pursuant to Contract No. W-31-109-ENG-38 between the U.S. Department of Energy and the University of Chicago representing Argonne National Laboratory.

BACKGROUND OF THE INVENTION

1. Field of the Invention

This invention relates to a method for producing diamonds, and more specifically, this invention relates to a method for producing nanometer-sized diamonds from carbonaceous materials by ion irradiation.

2. Background of the Invention

Nanodiamonds have various technological applications, including as fine polishing and grinding abrasives. Other possible uses for nanodiamonds include their use as powders with high thermal conductivity for use as heat sinks. Inasmuch as such media are both chemically resistant and electrically nonconducting, their suspension in advanced coolant fluids will enhance heat transport.

Nanodiamonds also can be utilized as an admixture in advanced composite materials to enhance thermal conductivity or surface hardness.

Lastly, nanodiamonds may be utilized as seed crystals for growth of larger diamonds.

The free energy difference between diamond and graphite is small. However, transformation between the two allotropes is difficult. This is because the high stability of the basal graphite planes requires the presence of catalysts, or thermodynamic conditions deep within the diamond phase region, for solid-state transformation of graphite into diamond.

A myriad of techniques exist to produce nanodiamonds. However, these processes require extreme conditions, such as high pressure, high temperature, or high irradiation fluence. For example, efforts at the Max-Planck-Institut in Stuttgart Germany, Wesolowski et al. *Appl. Phys. Lett.* 71 (14), pp 1948–1950, Oct. 6, 1997, have produced nanodiamonds but only after soot is irradiated for 30 hour at temperatures of between 700 and 1100° C. at high ion fluences of more than $10^{19}$ ions-cm$^{-2}$.

Earlier research at the same institute, Banhart et al., *Nature* 382 pp 433–435 (1996) discloses a method for diamond production by irradiating carbon onions with high electron fluences of more than $10^{24}$ $e^{-cm-2}$ at a sample temperature of 700° C.

Explosive shock methods for nanodiamond formation are also known.

Nanometer-size diamonds are the detonation products of reactions described throughout the scientific literature, including "Diamonds in Detonation Soot," *Nature* Vol. 333, pp 440 (Jun. 2, 1988). Additional methods for producing and modifying nanodiamonds are disclosed in "Influence of the Molecular Structure of Explosives on the Rate of Formation, Yield, and Properties of Ultradisperse Diamond," Combustion, Explosion, and Shock Waves, Vol. 30, No. 2, pp 235–238 (Plenum Publishing Corp, New York, N.Y. 1994), which is a translation of *Fizika Goreniya i Vzryva*, Vol. 30, No. 2, pp. 102–106, March–April 1994. Diamonds ranging in size of from 2–20 nanometers are produced in methods described in "Synthesis of Ultradispersed Diamond in Detonation Waves" Combustion, Explosion, and Shock Waves, Vol 25, No. 3, pp 372–379, (Plenum Publishing Corp. New York, N.Y. 1994), which is a translation of *Fizika Goreniya i Vzryva*, Vol. 25, No. 3, pp 117–126, May–June, 1989.

Other sources and methods for obtaining nanodiamonds can be found in U.S. Pat. No. 5,709,577, issued on Jan. 20, 1998.

None of the prior art discussed supra provides a method for obtaining nanodiamonds under relatively mild conditions.

A need exists in the art for a process to produce nanometer sized diamonds at room temperature and at ambient pressures. The process should yield diamonds from a myriad of carbonaceous materials and in reasonably short periods of time. Furthermore, the process should isolate the product diamond from the carbonaceous starting material with a minimum of product loss and effort.

SUMMARY OF THE INVENTION

It is an object of the invention to provide a method for producing nanodiamonds that overcomes many of the disadvantages of the prior art.

Another object of the present invention is to provide an economical method for producing nanodiamonds. A feature of the invention is that any high carbon content carbonaceous material can be transformed to diamond at room temperature. Another feature of the invention is the use of acid dissolution to isolate the diamond product from the carbonaceous material. An advantage of the invention is the elimination of the need for high-temperature, high-pressure processing.

Still, another object of the present invention is to provide a process for producing diamonds using ion irradiation. A feature of the invention is the use of ion radiation at energies of at least approximately 50 MeV. An advantage of the invention it is thought that the ion-irradiation may lower the free energy barrier for transformation between carbonaceous starting material and the diamond product. In one embodiment, approximately 0.02 diamonds are produced per ion for 350±50 MeV Kr irradiation of graphite at 20° C. and at low ambient pressure, less than about $10^{-1}$ Torr and preferably less than about $10^{-3}$ Torr.

Briefly, the invention provides a method for producing diamonds, the method comprising exposing carbonaceous material to ion radiation at ambient temperature and reduced pressure conditions in a vacuum for a time sufficient to transform the carbonaceous material to diamond.

The invention also provides a method for producing diamonds comprising subjecting graphite to at least approximately 50 MeV ion radiation at room temperature and at a reduced pressure in a vacuum chamber for a time sufficient to transform the graphite into diamond.

BRIEF DESCRIPTION OF THE DRAWING

The invention together with the above and other objects and advantages will be best understood from the following detailed description of the preferred embodiment of the invention shown in the accompanying drawing, wherein:

FIG. 3 is a table of comparisons of diffraction maxima of produced diamond versus reference values.

DETAILED DESCRIPTION OF THE INVENTION

Figure 1:
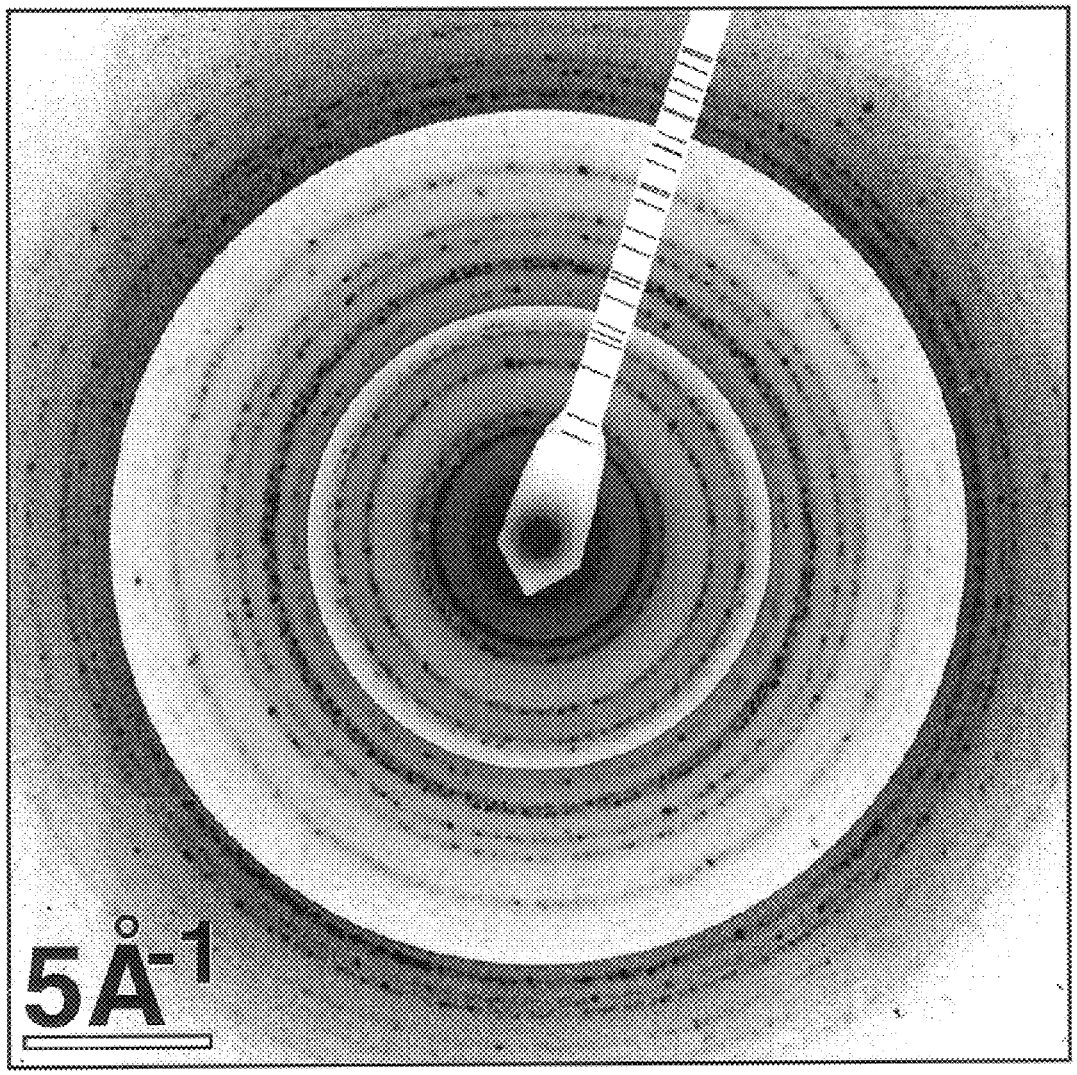
FIG. 1 is an electron diffraction pattern of diamonds produced in accordance with features of the present invention.

The inventors have devised a method whereby ion irradiation of bulk carbonaceous material at low pressure ($<10^{-1}$ Torr) and ambient temperature transforms the material into diamond. Specifically, nanometer-sized diamonds are formed by the direct solid-state transformation of bulk graphite at room temperature by low-fluence ion irradiation of the graphite. The maximum size of the individual diamond crystals that can be formed by the ion radiation is limited by the size of the ion-damage track, which varies with the energy and mass of the ion used. Herein, ambient temperature is the temperature that the carbonaceous material is maintained at during ion irradiation. The ambient temperature can be maintained at approximately 20° C. by appropriate cooling apparatus or may be allowed to increase in response to energy inputted by ion irradiation.

When 350 MeV krypton ions are used, the ion damage track is approximately 10 nm in diameter, translating into an upper size limit for resulting diamonds of 10 nanometers (nm). The mean radius of the diamonds in this instance is approximately 3.6 nm±2.2 nm. It is believed that with other ion energies and masses, the upper limit on the diamond sizes of from about 30 nm up to about 40 nm can be obtained.

The free-energy difference between diamond and graphite is very small; thus, under appropriate conditions both allotropes will form. The inventors have found that point defects in carbon lattices produced by ion irradiation could lower the free energy barrier for transformation. The resulting highly disordered regions in the graphite may transform to diamond upon recrystallization as the energy (from the impinging radiation) rapidly dissipates into the surrounding lattice. Furthermore, this recrystallization occurs in the ion-particle tracks without the need of annealing at elevated temperature. The transformation efficiency (350±50 MeV Kr ion) is such that between approximately 2 percent and 8 percent of the lattice regions transform to diamond particles.

The invented technique can be utilized to produce diamonds from any high carbon content carbonaceous material via heavy ion (mass greater than approximately 60 amu) irradiation having energies greater than 50 MeV. More specifically, ion irradiation of polycrystalline graphite using ions having mass and energies similar to uranium fission fragments typically yield nanodiamonds with a mean radii of approximately 3.6 nm. The diamond yields of this technique using $6 \times 10^{12}$ Kr-ions-cm$^{-2}$ at 350±50 MeV at 20° C. is between approximately 0.02±0.01 nanometer diamonds/ion. Diamond yields will depend on ion irradiation conditions, including ion mass and energy, as well as substrate temperature and the target. Yields in the range of 0.02 to 10 can be achieved, while yields of 0.02 to 0.5 are more probable, and yields of 0.02 to 0.1 most probable.

The diamonds are subsequently isolated from the bulk graphite by removing the graphite via acid oxidation in acid dissolution, as depicted in the following equation

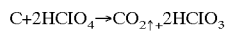

$$C + 2HClO_4 \rightarrow CO_2\uparrow + 2HClO_3$$

A 70 percent recovery efficiency via acid dissolution is estimated. Losses are the result of adherence to container surfaces, incomplete recovery from colloidal suspension and the like.

Acid Dissolution Detail

The diamond products are isolated from the ion-irradiated bulk graphite via acid dissolution treatment. This is a modification and improvement of an exemplary acid treatment method is disclosed in S. Amari, et al. *Geochim. Cosmochim, Acta* 58, pp 459–470 (1994), and incorporated herein by reference.

The basic procedure of the acid treatments involves the oxidation of graphitic carbons by gradual heating (100° C./hr up to 200° C.) in a solution of (7:2:1) $HClO_4$, $H_2SO_4$, and $HNO_3$ also containing 0.0003M $Cr^{+6}$ (the Chromium of which acts as a catalyst and as an indicator). Other suitable catalyst/indicator metals include vanadium and cerium.

Colloidal properties of nanodiamonds are controlled by the pH of the solution. This is due to the presence of acidic carboxyl groups (—COOH) on their surfaces. Any nanodiamonds present following both oxidations are placed in colloidal suspension using 0.1 N $NH_4OH$. Centrifugation was used to separate the suspended diamonds from whatever coarse particles survived (or which were contaminants during the processing). After the coarse particles are removed, the nanodiamonds are then recovered from the suspension by adding HCl until the solution reaches a pH of less than one. The acid treatments were applied twice to the samples. At this pH range, the diamonds aggregate together and can be removed via centrifugation.

Carbonaceous Material and Diamond Material Detail

Diamond can take two structural forms, that of cubic diamond structure and that of hexagonal diamond structure. The predominant form of diamond produced by room temperature (i.e., between 17° C. and 26° C.) ion irradiation is cubic diamond structure. The diamond crystals are generally twinned and occur as multiply-twinned crystals; however, single crystal (mono-crystalline) diamonds are also observed. A twinned crystal is one that has some of its close packed planes of atoms stacked incorrectly in relation to its structure.

Generally, the method produces diamonds while the material is maintained at room temperature or else not thermally annealed during irradiation. While a myriad of pressures can be present during transformation, low pressure ($10^{-1}$ Torr) is all that is required.

A myriad of carbonaceous materials can be utilized in the diamond transformation process, including, but not limited to graphite, lignite, coal, kerite, or combinations thereof. Generally, while the efficiency of the process is maximized when pure forms of carbon are utilized, substrates containing at least 20 percent carbon are also suitable.

Ion Radiation Detail

Low fluence radiation is utilized in this invention. Generally fluence values of from $10^{12}$ ions-cm$^{-2}$ to $10^{16}$ ions-cm$^{-2}$ are suitable. At the lower end of this fluence range, the inventors have found that the number of diamonds produced is proportional to the number of ions impinging upon the graphite substrate. At higher fluence rates, ions tend to "hit" the same area so that an earlier ion produces a diamond particle but a subsequent ion could destroy it.

To avoid possible destruction of diamond particles while employing higher ion fluences, a series of ion irradiations can be performed using progressively lower energy ions (hence shorter ion ranges). Since the ranges of lower energy ions are shorter than higher energy ions, some of the destruction of previously formed diamond products is avoided since ion-overlap is reduced. This is particularly advantageous if previously formed diamonds reside near the end of the particle tracks, the ions of subsequent lower energy irradiations will have insufficient range to reach those previously formed diamonds.

Flux rates determine the number of ions that impact the graphite substrate per second. The higher the flux rate, the faster the transformation occurs. However, the inventors have found that higher flux rates (i.e., higher energy input into the substrate) results in temperature increases. The diamond production method is viable at temperatures approaching the melt temperature of the carbon-containing substrate. Generally, flux rates that induce substrate temperatures of up to 400° C. are not problematic. The substrate temperature should be maintained at less than 500° C. Heating of the substrate is by ion irradiation heating and not by external heat sources, such as resistance heating, radiative, chemical or nuclear.

Alternatively, flux rates can also be chosen based on the temperature at which the system is to operate. In one instance, the efficiency of heat sinks contacting the carbon-containing substrate will determine suitable flux values. In cases where the substrate is to be maintained at room temperature, flux rates of between $2 \times 10^{10}$ ions-cm$^{-2}$-s$^{-1}$ and $2 \times 10^{12}$ ions-cm$^{-2}$-s$^{-1}$ are suitable.

Time of exposure of the carbonaceous material to the ion radiation will depend on the fluence and flux rates. If a particular process time is desired, the fluence and flux rates will be adjusted to arrive at the exposure durations. Generally, desired total fluence values divided by flux values are a good indication of the time needed to produce desired number of diamonds.

Energy of the radiation can vary, but must be adequate to first produce damage to the lattice of the carbon substrate material. Conversely, the energy must not be so high as to have the ion completely pass through the substrate with no transference of energy to the substrate. Generally, energy of between 50 MeV and 1000 MeV are suitable.

Ion masses also can vary. Heavier ions will create greater irradiation damage for a given energy than lighter ions. This greater force will lead to deeper penetration of the ions into the graphite and therefore greater exposure of the graphite to the ions. Generally, ions from the elements heavier than iron, which has an atomic weight of 55.8, is suitable. Exemplary elements include, but are not limited to the group consisting of Kr, Xe, Pb, Hg, U, and Rn.

Gaseous elements, such as krypton and xenon confer greater utility as ion sources due to the ease in producing an ion beam from the vapor phase. For the same energy, xenon is preferable over krypton because of its heavier mass and greater irradiation damage it produces. Depending on the energy imparted to the ion, substrate thicknesses can be tailored to the impact depths of the ion. For example, if a xenon ion has an impact depth of 50 microns ($\mu$m), then when both sides of a 100 micron-thick substrate are irradiated with the xenon ions, the entire substrate is "exposed" to the ions. The example below has more specifics of a krypton irradiation.

EXAMPLE

A process for irradiating carbonaceous material is disclosed in Daulton et al., *Mat. Res. Soc. Symp. Proc.* 540, pp. 189–194 (1999) and incorporated herein by reference.

Briefly, fine grain polycrystalline graphite sheets of 125 $\mu$m thickness, 1.8 g-cm$^{-2}$ density and 99.95 percent carbon purity were cut into approximately 1.0 cm by 1.5 cm pieces. The carbon was obtained from Goodfellow Corp of Berwyn, Pa. Ion irradiations were performed at the Tandem Linear Accelerator System at Argonne National Laboratory in Argonne, Ill.

The graphite was mounted on Cu heat sinks cooled to 20° C. The specimens were irradiated individually by 400 MeV Kr on both sides at a flux of $2 \times 10^{10}$ ions-cm$^{-2}$. Ion irradiations were restricted to a low fluence ($6 \times 10^{12}$ ions-cm$^{-2}$) to limit ion overlap.

A gold-scattering foil was placed in the ion-beam path to spread the beam so that the entire exposed surface of the specimen was irradiated. This resulted in a dispersion and reduction of the energies of the Kr ions to approximately 350 MeV±50 MeV. The penetration ranges of the ions were estimated to be approximately 44±6 $\mu$m using the binary collision approximation disclosed in Biersack et al. *J. Nucl. Inst. and Methods* 174, pp 257–269 (1980). Inasmuch as both sides of the 125 $\mu$m thick specimens were ion irradiated, approximately ⅔ of the bulk of each specimen received irradiation.

Both the irradiated samples and controls were subjected to the standard acid dissolution protocols, discussed above. Any diamonds present in the resulting residue were ultrasonically suspended in 12 $\mu$l of 4:1 mixture of isopropanol and $H_2O$. HCl was then added to partially cluster any diamonds present. 1–2 $\mu$l aliquots of this solution were deposited on 3 mm Cu transmission electron microscope (TEM) grids coated with either holey amorphous carbon film used for imaging or amorphous-SiO film used for analytical measurements.

The samples were characterized using high resolution and analytical TEMs. Lattice imaging was performed using a JEOL JEM-4000EX high-resolution TEM. Analytical elemental analysis was performed using a Philips CM30 TEM equipped with a Parallel Electron Energy Loss Spectrometer (PEELS) and an Energy Dispersive X-ray Spectrometer (EDXS). As illustrated in FIG. 1, transmission electron microscopy showed that acid residue of ion-irradiated graphite contained nanometer-sized crystals (nanocrystals) which were dispersed nonuniformly on the support film. FIG. 1 is an electron diffraction pattern of nanocrystals found in irradiated graphite acid residue. By comparison, the acid residue of an unirradiated graphite control contained orders of magnitude less nanocrystalline material. This comparison indicates that a large fraction of nanocrystals recovered from the irradiated graphite were products of ion irradiation. Furthermore, that the crystals survived acid dissolution indicates the presence of diamond.

To illustrate all of the reflections in the diffraction pattern, three intensity scale changes were applied to the diffraction pattern after the pattern was digitized from a single film exposure. Inasmuch as diffraction patterns are measured in inverse length units, the scale bar is 50 nm$^{-1}$ in length.

Figure 2:
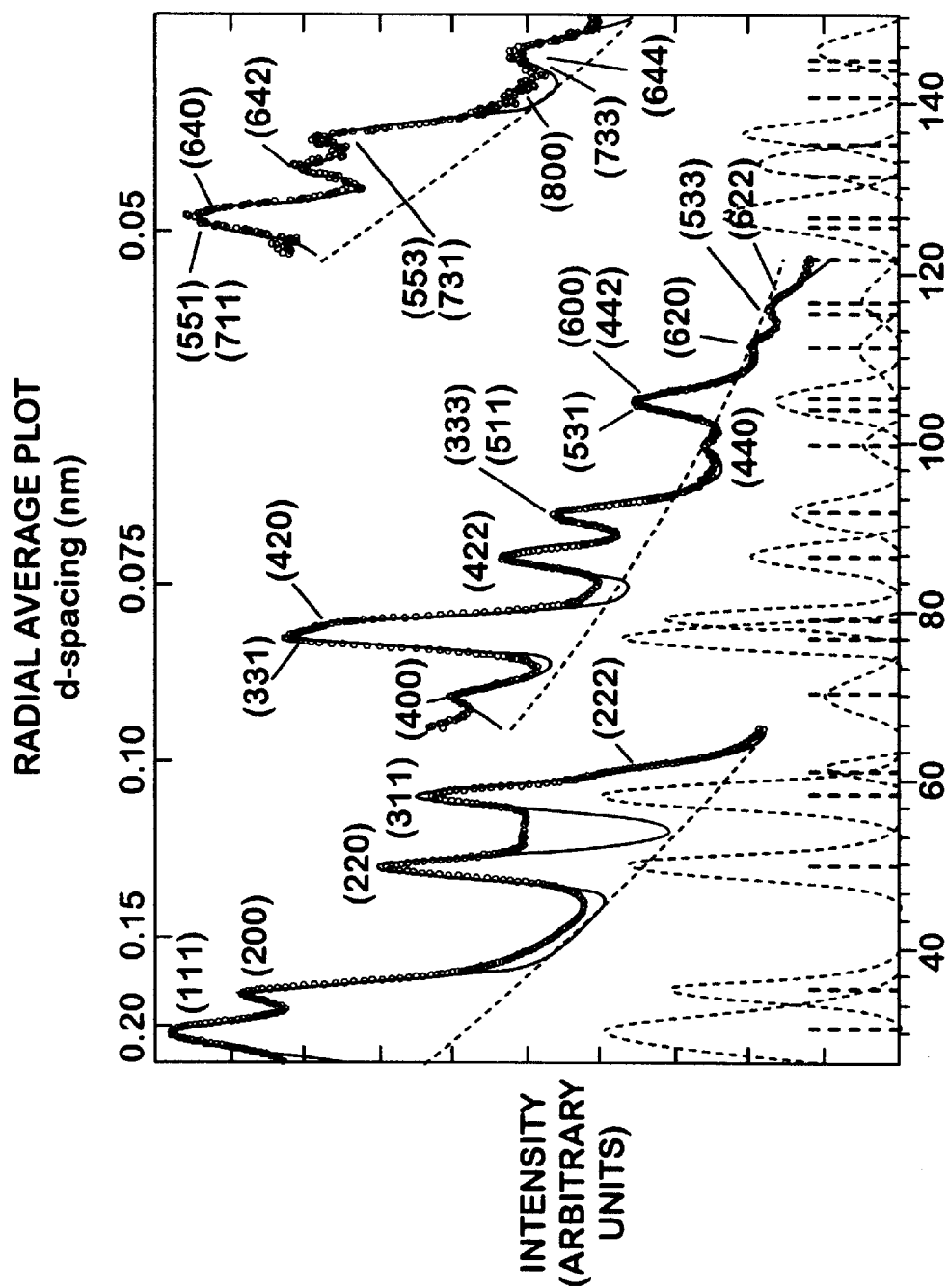
FIG. 2 is a comparison graph of diffraction maxima of produced diamond versus reference values.

As is depicted in FIG. 2, the measured diffraction maxima for the isolated nanocrystals match those predicted for diamond. The top horizontal axis depicts the d-spacing. The d-spacing represents the spacings between lattice planes in a crystal, and is defined by the following equation:

$$d=(2\pi)/q$$

wherein q is defined as the reciprocal lattice spacing and is measured in inverse units, for instance nm$^{-1}$.

The incident electron beam of the TEM is scattered (or diffracted) off the lattice planes in the crystals, resulting in the diffraction maxima observed. Substantially all of the maxima of the experimentally derived crystals (depicted by the solid curve) match those predicted for cubic diamond crystals (depicted by the dashed curves along the horizontal axis).

FIG. 3 is a tabulation of comparisons of d-spacings measured by electron diffraction of the isolated nanocrystals to cubic diamond. The h, k, l designation in the first column represent the diffraction maxima arising from electron diffraction off a set of atomic planes indexed with integers h,k,l with respect to the crystal basis vectors. Experimental error for the measured d-spacings is approximately ±0.01 Å.

Elemental analysis using energy dispersive X-ray spectrometry on the regions containing high nanocrystal concentrations in the irradiated graphite acid residue indicated predominantly Si, O and Cu (from the support film and grid). The only other elements present were C, Cl and S in roughly 9:4:1 proportions. This indicates that most of the nanocrystals are carbon. Therefore, transmission electron microscopy characterizations of the residues indicate that the invented method produces diamonds.

While the invention has been described with reference to details of the illustrated embodiment, these details are not intended to limit the scope of the invention as defined in the appended claims.

The embodiment of the invention in which an exclusive property or privilege is claimed is defined as follows:

1. A method for producing diamonds, the method comprising exposing carbonaceous material to ion radiation at ambient temperature and low pressure using a flux rate and irradiation time sufficient to transform the carbonaceous material to diamond wherein the diamond is formed within the bulk of the carbonaceous material.

2. The method as recited in claim 1 wherein the ion radiation comprises ions of elements having an atomic mass greater than approximately 60 amu.

3. The method as recited in claim 1 wherein the ion radiation comprises energies greater than 50 MeV.

4. The method as recited in claim 1 wherein the carbonaceous material contains at least 20 percent carbon by weight.

5. The method as recited in claim 1 wherein the carbonaceous material is a high carbon content substrate selected from the group consisting of graphite, lignite, coal, kerite, and combinations thereof.

6. The method as recited in claim 1 wherein the time is determined by the total ion fluence divided by the ion flux rate, whereby ion fluence is the number of ions per square centimeter and ion flux rate is the number of ions per square centimeter per second.

7. The method as recited in claim 6 wherein the fluence is between $10^{12}$ ions-cm$^{-2}$ and $10^{16}$ ions-cm$^{-2}$.

8. The method as recited in claim 6 wherein the flux rate is between $10^{10}$ ions-cm$^{-2}$-s$^{-1}$ and $10^{12}$ ions-cm$^{-2}$-s$^{-1}$.

9. The method as recited in claim 1 wherein the diamond is isolated from the carbonaceous material via chemical dissolution of the material.

10. The method as recited in claim 1, wherein the carbonaceous material is maintained at room temperature during irradiation.

11. The method as recited in claim 1 wherein the diamonds have diameters up to 40 nm.

12. The method as recited in claim 1 wherein between 0.02 and 0.08 diamonds are produced per ion.

13. A method for producing diamonds comprising subjecting graphite to at least 50 MeV ion radiation at room temperature and at low pressure using a flux rate and irradiation time duration sufficient to transform the graphite into diamond.

14. The method as recited in claim 13 wherein the ion radiation comprises ions of elements which are in the gaseous phase at room temperature and pressure.

15. The method as recited in claim 13 wherein the ion radiation comprises ions of krypton at 350 MeV.

16. The method as recited in claim 15 wherein the ion radiation has a fluence of $6\times10^{12}$ ions-cm$^{-2}$ and a flux of $2\times10^{10}$ ions-cm$^{-2}$sec$^{-1}$.

17. The method as recited in claim 16 wherein the time is 300 seconds.

18. The method as recited in claim 17 wherein two percent of the number of ions produce diamonds.

19. The method as recited in claim 13 wherein the graphite is maintained at 20° C.

20. The method as recited in claim 13 wherein the entire graphite is exposed to at least 50 MeV ion radiation.

* * * * *